(12) United States Patent
Zandbergen et al.

(10) Patent No.: US 7,989,155 B2
(45) Date of Patent: *Aug. 2, 2011

(54) LITHOGRAPHIC METHOD

(75) Inventors: Peter Zandbergen, Hechtel-Eksel (BE); Jeroen H Lammers, Eindhoven (NL); David Van Steenwinckel, Holsbeek (BE)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/065,930

(22) PCT Filed: Sep. 5, 2006

(86) PCT No.: PCT/IB2006/053117
§ 371 (c)(1),
(2), (4) Date: Mar. 6, 2008

(87) PCT Pub. No.: WO2007/029177
PCT Pub. Date: Mar. 15, 2007

(65) Prior Publication Data
US 2009/0130611 A1    May 21, 2009

(30) Foreign Application Priority Data
Sep. 6, 2005 (EP) .................... 05108172

(51) Int. Cl.
G03F 7/40 (2006.01)
G03F 7/38 (2006.01)
(52) U.S. Cl. .................. 430/325; 430/330; 430/322
(58) Field of Classification Search .......... None
See application file for complete search history.

(56) References Cited

U.S. PATENT DOCUMENTS

| | | | |
|---|---|---|---|
| 5,178,989 A * | 1/1993 | Heller et al. | 430/323 |
| 5,545,509 A | 8/1996 | Cameron et al. | |
| 5,776,660 A | 7/1998 | Hakey et al. | |
| 5,968,712 A | 10/1999 | Thackeray et al. | |
| 6,114,082 A | 9/2000 | Hakey et al. | |
| 6,153,349 A * | 11/2000 | Ichikawa et al. | 430/170 |
| 6,200,726 B1 | 3/2001 | Chen et al. | |
| 6,313,492 B1 | 11/2001 | Hakey et al. | |
| 6,338,934 B1 | 1/2002 | Chen et al. | |
| 6,495,307 B2 | 12/2002 | Uetani et al. | |
| 6,534,243 B1 | 3/2003 | Templeton et al. | |
| 6,780,569 B1 | 8/2004 | Hudson et al. | |
| 6,787,283 B1 | 9/2004 | Aoai et al. | |
| 2001/0046641 A1 * | 11/2001 | Uetani et al. | 430/270.1 |
| 2003/0031956 A1 | 2/2003 | Wijnaendts et al. | |
| 2003/0175620 A1 | 9/2003 | Toishi et al. | |

FOREIGN PATENT DOCUMENTS

| | | |
|---|---|---|
| EP | 0558280 A1 | 9/1993 |
| EP | 0660187 A1 | 6/1995 |
| EP | 0810477 A2 | 3/1997 |
| JP | 2000199953 A | 7/2000 |
| WO | 0113179 A1 | 2/2001 |

* cited by examiner

Primary Examiner — Daborah Chacko Davis

(57) ABSTRACT

The present invention provides a method of lithographic patterning. The method comprises: applying to a surface to be patterned a photoresist (18) comprising a polymer resin, a photocatalyst generator which generates a catalyst on exposure to actinic radiation, and a quencher; exposing the photoresist (18) to actinic radiation through a mask pattern (12); carrying out a post-exposure bake; and then developing the photoresist (18) with a developer to remove a portion of the photoresist which has been rendered soluble in the developer. Either the polymer resin is substantially insoluble in the developer prior to exposure to actinic radiation and rendered soluble in the developer by the action of the catalyst, and by the action of the quencher during the bake, or the polymer resin is soluble in the developer prior to exposure to actinic radiation and rendered substantially insoluble in the developer by the action of the catalyst, and by the action of the quencher during the bake.

14 Claims, 2 Drawing Sheets

LITHOGRAPHIC METHOD

CROSS REFERENCE TO RELATED APPLICATIONS

This application is related to a concurrently filed application titled, "Lithographic Method," Ser. No. 12/065,926 of the same inventors; the concurrently filed application is incorporated by reference in its entirety.

The invention relates to a lithographic method, and particularly to a lithographic method suitable for defining very small features at large packing densities.

Optical lithography is most commonly used to pattern semiconductors, since the fine details achievable using modern optical lithography systems are well suited to semiconductor manufacture. However, the approach can be used in other technology fields as well, including nanotechnology, the manufacture of diffraction gratings, or indeed any field in which fine patterns are required.

In conventional optical lithography, the patterning may be achieved by the illumination of a radiation-sensitive film (a photoresist) through an intervening patterned mask. Exposure to the light causes a chemical reaction which renders the photoresist more or less soluble in a particular solvent (developer). The more soluble areas of the photoresist are removed by treating the exposed photoresist with the developer. The photoresist may be a so-called positive or negative photoresist. In a positive photoresist the initially unexposed photosensitive film is essentially insoluble in the developer and becomes soluble if the exposure to actinic radiation is above a threshold value. Conversely, a negative photoresist, the initially unexposed photosensitive film is soluble in the developer and becomes essentially insoluble if the exposure to light is above a threshold value.

Development of the exposed photoresist with the developer dissolves the portion of the photoresist rendered soluble to provide lines and spaces. Patterning of the substrate can then proceed in the usual way by etching, ion implanting or otherwise treating the surface of the substrate.

However, there is a continuing demand to pattern smaller and smaller features. In lithography, the smallest pitches that can be printed by an optical imaging system are limited by the optical resolution of the imaging system. In general, the smallest pitch p at which features can be printed is defined by the equation:

$$p/2 = k_1 \lambda / NA$$

where NA is the numerical aperture of the imaging system, $\lambda$ is the wavelength of the light used in the imaging system and $k_1$ is a process-dependent constant that reflects everything about the lithography process apart from the wavelength and numerical aperture. The diffraction-limited minimum value of $k_1$ is 0.5 for coherent light.

For dense features in which the line:space ratio is 1:1 the resolution R is given by p/2, i.e.

$$R = p/2 = k_1 \lambda / NA.$$

A number of approaches to minimise p are possible. One approach is to minimise the wavelength A of the light used, and this has led to the development of imaging systems using short wavelength ultra-violet light or even x-rays. Another approach is to reduce $k_1$, for example by using incoherent light, off-axis illumination or phase-shift masks. Using such techniques, the value of $k_1$ is reduced towards its theoretical minimum value of 0.25.

A difficulty with systems with low values of $k_1$ is that the light from the optical modulation system will not have a hard edge. In general, only the lower diffraction orders pattern is captured by the lens in the optical imaging system and this means that the modulation of the light across the surface of the substrate to be printed is essentially sinusoid.

A number of methods have been proposed to pattern features at a smaller pitch than this by achieving more than one feature per optical period.

US 2003/0031956 produces two features per optical period by patterning features twice, shifting the mask by a very small amount between each patterning step. However, such very small shifts, by less than the optical period are very difficult to achieve reliably.

An alternative approach is described in U.S. Pat. No. 6,534,243. In this approach, resist is formed and patterned, leaving resist regions and gaps between the resist region. A coating is formed over the whole surface. A deprotection region is then formed in the remaining resist and removed, leaving two features. However, the process for forming the deprotection region requires a further unmasked exposure after forming the resist regions and makes use of differential properties of the photoresist at the edges of the resist and in the centre of the resist using hydroxide ions in the coating which diffuse into the edges of the resist mopping up acid generated but not into the central deprotection region. Accordingly, process control in this process may be difficult.

A further option is the hybrid resist described in U.S. Pat. No. 6,338,934. This describes the use of a photoresist with both a photo-acid generator (PAG) and a photo-base generator (PBG). For example, the PAG may release an acid above a certain threshold dose (d1) and the PBG would release a quencher molecule above a second threshold dose (d2) with d2>d1. In this way, the enhanced solubility of resist is achieved for intermediate exposures. Thus, when exposed by a sinusoidal pattern of light intensity, the peaks and troughs are soluble and the intermediate regions insoluble thereby leading to frequency doubling. U.S. Pat. No. 6,338,934 describes a further refinement, and that is that the photoresist can be used either as negative or positive photoresist. However, this approach requires the use of a complicated photoresist including a photochemically activated quenching agent.

There thus remains a need for an improved lithographic method for providing frequency doubling.

According to the present invention there is provided a method of lithographic patterning, comprising: applying to a surface to be patterned a photoresist comprising a polymer resin, a photocatalyst generator which generates a catalyst on exposure to actinic radiation, and a quencher; exposing the photoresist to actinic radiation through a mask pattern; carrying out a post-exposure bake; and then developing the photoresist with a developer to remove a portion of the photoresist which has been rendered soluble in the developer; wherein either the polymer resin is substantially insoluble in the developer prior to exposure to actinic radiation and rendered soluble in the developer by the action of the catalyst, and by the action of the quencher during the bake, or the polymer resin is soluble in the developer prior to exposure to actinic radiation and rendered substantially insoluble in the developer by the action of the catalyst, and by the action of the quencher during the bake.

The method according to the present invention provides frequency doubling in the resist with the advantage that it provides such a resist without any additional processing steps, i.e. using only the conventional processing steps of applying the photoresist to the substrate, exposing the photoresist to actinic radiation, and then developing and baking the photoresist.

For a better understanding of the invention, an example will now be described, purely by way of example, with reference to the accompanying drawings, in which.

Figure 1:
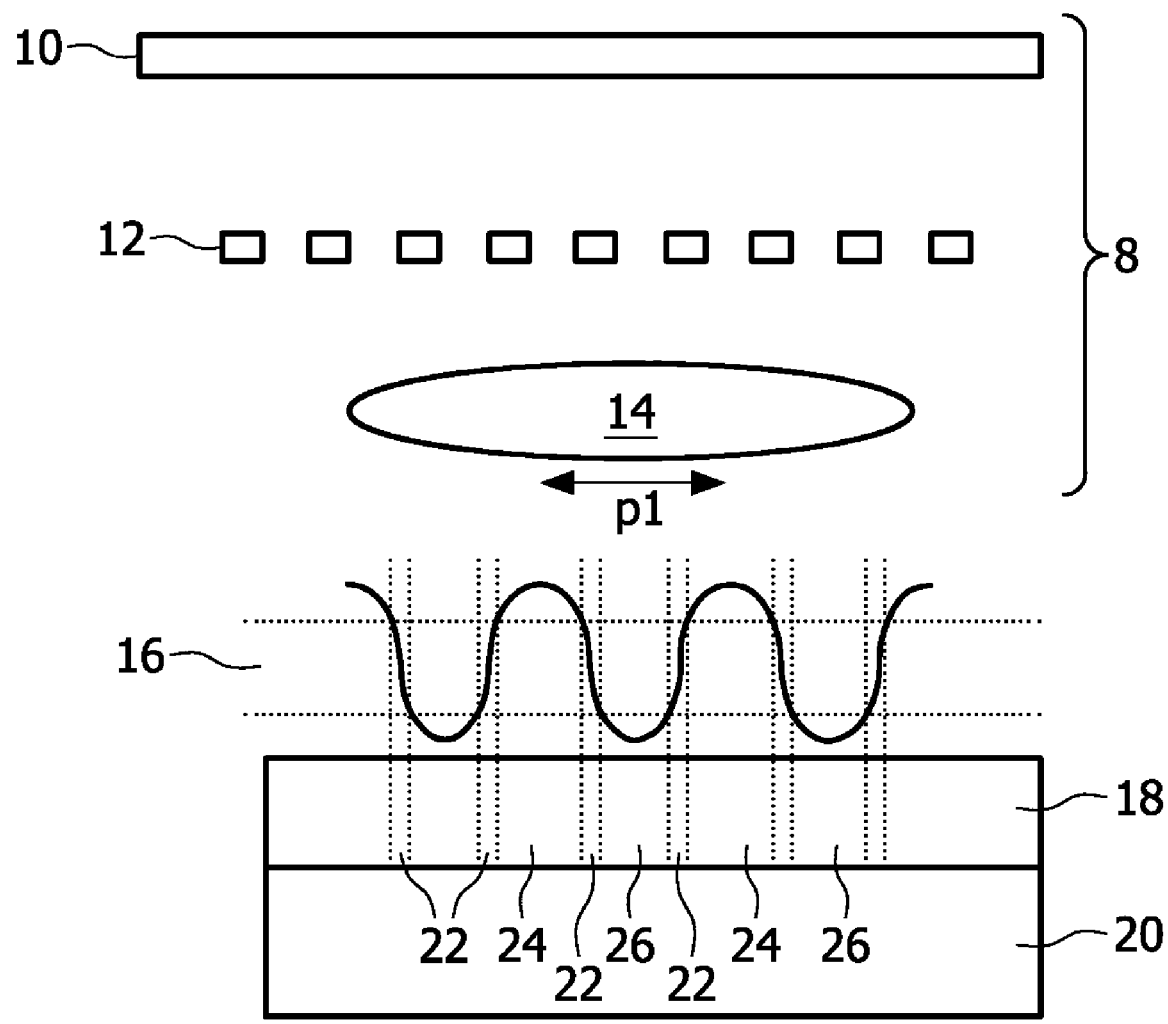
FIG. 1 illustrates a first processing step of a method according to the invention.

As shown schematically in FIG. 1, an optical system 8 includes a diffuse source of light 10, a mask 12 and an optical imaging system 14 here represented by a lens. As the skilled person will appreciate, the imaging system will in practice be more complicated than represented here but these additional details are well known in the art and so will not be presented further.

The optical system creates a pattern of light 16 across the surface of the photoresist 18 on substrate 20, here a semiconductor substrate 20. The exposure varies essentially sinusoidally across the substrate caused by the first order image of the mask 12, which here consists of regularly spaced lines. The intensity varies sinusoidally across the surface with a pitch $p_1$.

The exposure thus creates areas of high exposure 24 in which the exposure is above first threshold, areas of low exposure 26 in which the exposure is below a second threshold, and areas of intermediate exposure 22 between the areas of high and low exposure 24,26.

The photoresist 18 contains a photocatalyst generator which generates a catalyst on exposure to actinic radiation. However, no catalyst is generated in areas which are not exposed to actinic radiation. The photocatalyst generator may be a photoacid generator which generates an acid on exposure to actinic radiation or a photobase generator which generates a base on exposure to actinic radiation. Photoacid generators and photobase generators are well known in the art. Preferred photoacid generators include aromatic substituted halohydrocarbons, halo-substituted sulphur-containing compounds, halohetercyclic compounds, onium salts, sulfonated esters and sulfonated ketones. Further examples are disclosed in U.S. Pat. No. 6,534,243. The photocatalyst generator is preferably present at 0.5-30%, more preferably 1-10% and most preferably about 5% by weight based on the total weight of the photoresist 18.

In order to enhance the contrast between areas 24 where the catalyst is generated and areas 26 where the catalyst is not generated, a quencher is typically incorporated into the photoresist. Quencher loading is in the region of 5-20% by weight, preferably about 10% by weight based on the total weight of the photocatalyst prior to exposure, i.e. the photocatalyst loading. The photo-generated catalyst is thereby neutralised by the quencher in areas of low exposure and to some extent in areas of intermediate light exposure. In areas where there is no light exposure, there is no catalyst generation and hence no reaction between the catalyst and the quencher. In areas of high exposure, the amount of quencher incorporated into the photoresist 18 is necessarily insufficient to neutralise the photo-generated catalyst and hence the photo-generated catalyst is able to perform its function of catalysing the modification in the solubility of the polymer resin.

Where a photoacid generator is used, an acid will be generated. In such a case, the quencher will necessarily be basic, i.e. capable of reacting with the acid to neutralise the acid. Quenchers are also well known in the art. The quencher is preferably an aqueous base quencher. Examples of basic quenchers are amines, such as 1,10-diaminodecane, tributylamine and tetrabutylammonium hydroxide.

Thus, a typical photoresist 18 for use in lithography comprises a polymer resin, a photocatalyst generator which generates a catalyst on exposure to actinic radiation, and a quencher. The present invention results from the realisation that the excess quencher may be used to provide frequency doubling by using a resin which is modified by the quencher on heating, so-called dark area deprotection.

In the case of a positive photoresist, as well as being substantially insoluble in the developer prior to exposure to actinic radiation and soluble in the developer by the action of the catalyst—which is a standard property of polymer resins used in the art, the polymer resin used in the present invention must also be capable being rendered soluble by the action of the quencher during heating at baking temperatures, e.g. 100-160° C., preferably 110-130° C., particularly preferably about 120° C., for 1-2 mins, preferably about 90 s. That is, the polymer resin undergoes thermally activated reaction in the presence of the quencher to increase the solubility. The polymer resin does not therefore undergo any reaction in the presence of the quencher prior to heating. These two functions of the polymer resin may be achieved by incorporating a polymer having functional groups which render the polymer substantially insoluble in the developer but become soluble in the developer by the action of the catalyst as well as functional groups capable of undergoing a reaction to form a soluble polymer by the action of the quencher during heating. The same functional groups may also perform both functions. The chemical nature of the polymer resin will depend on the chemical nature of the quencher and vice versa. However, reactions of functional groups which affect the hydrophilicity/hydrophobicity catalysed by, for example, acid or base are well known.

The above also applies mutatis mutandis to a negative photoresist.

The polymer preferably has back bone and plurality of hydrophobic groups which become hydrophilic on exposure to the catalyst, more preferably protected carboxylic acid groups. Such groups are selected such that they become hydrophilic in the presence of acid and also undergo thermally activated deprotection in the presence of a suitable base, i.e. a basic quencher unreactive to the polymer at ambient temperature but reactive at baking temperatures. Many other functional groups are known to undergo base-catalysed hydrolysis including carbonyl-containing groups, such as esters, ketones, lactones, amides and imides, and ethers, such as alkyl ethers, sulfonamides, epoxides and thioethers.

By way of example of a negative photoresist, the polymer resin may incorporate 2-cyano-2-(p-vinylphenyl)butanoic acid monomers. These monomers undergo base-catalysed decarboxylation in the presence of an amine. The decarboxylation reaction affords a product which is insoluble in aqueous base while areas in which the amine has been neutralised by the photo-generated acid remain soluble in aqueous base. The amine is required to have a sufficiently low volatility that it remains in the photoresist during baking. Preferably the amine has a boiling point above the baking temperature, e.g. 1,10-diaminodecane, tributylamine and tetrabutylammonium hydroxide. The polymer resin will also include a polymer which is rendered insoluble in the presence of the photo-generated acid. This may be a separate polymer of be copolymer with 2-cyano-2-(p-vinylphenyl)butanoic acid. Such materials are known in the art and are exemplified by t-BOC (tert-butyl carbonyl) protected resists, e.g. 248 nm DUV.

This is the step reached shown in FIG. 1.

Figure 2:
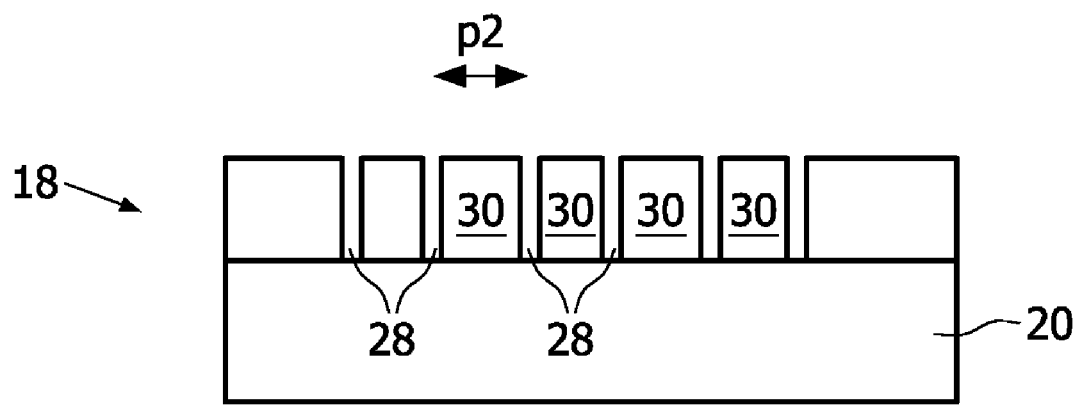
FIG. 2 shows the photoresist after development according to the present invention, in the case of a negative photoresist.
Figure 3:
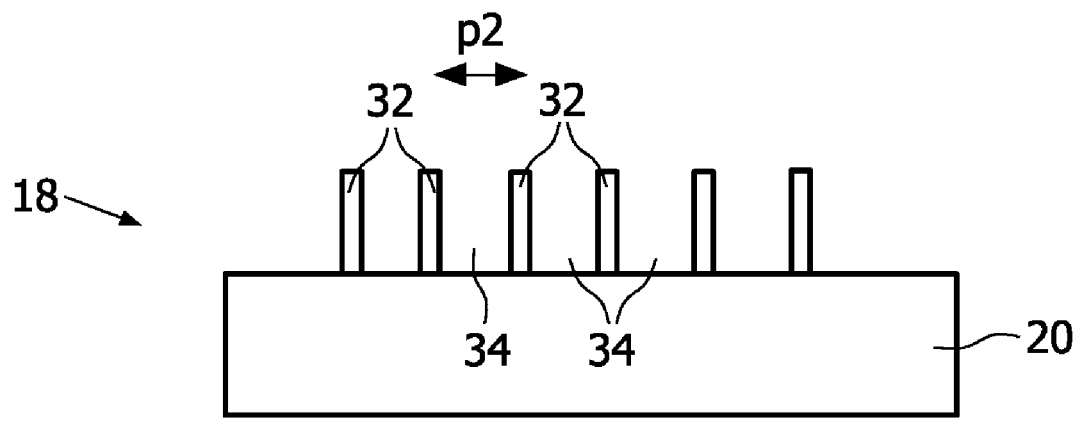
FIG. 3 shows the photoresist after development according to the present invention, in the case of a positive photoresist.

The photoresist 18 is then developed using a developer. With reference to FIG. 2, in the case of a negative photoresist 18, the developer dissolves the exposed portion of the photoresist to provide lines 30 and spaces 28. With reference to FIG. 3, in the case of a positive photoresist, the developer dissolves the exposed portion of the photoresist to provide lines 32 and spaces 34. Developing solvents are known in the art although the nature of the solvent will depend on the nature of the polymer resin used in the photoresist 18. Where the polymer resin has protected carboxylic acids as the functional groups, the developer is typically an aqueous solution of 0.26N TMAH (tetramethyl ammonium hydroxide). For good results, the dissolution process during development should be thermodynamically favourable as well as kinetically rapid. The speed of reaction is best determined by experiment. Thermodynamics does however allow some determinations of suitable solvents. In practice therefore experiment may represent a good way to determine suitable combinations of developer and photoresist.

Patterning of the substrate 20 can then proceed in the usual way by etching, ion implanting or otherwise treating the surface of the substrate.

Other standard components may be added to the photoresist 18, such as a light-absorbing dye, levelling agents (surfactants) and dissolution inhibitors. The formulation also includes the solvent in which the polymer is dissolved in order to carry out the spin coating process.

In a specific example a photoresist containing a polymer having protected carboxylic acid groups, tri-phenyl sulfonium nonaflate (tPS-Nf) as the photoacid generator and tributylamine may be deposited to a thickness of 280 nm on a substrate of silicon oxynitride (SiON) on silicon. An optical signal is used to expose the photoresist with a repeating pattern of period 360 nm across the substrate. A post exposure bake of 90 s at 120° C. is then applied to deprotect further the polymer. Aqueous 0.26N TMAH is then used as a developer, the exposed sample being placed in the developer for a period of 60 s at room temperature (22° C.).

An electron micrograph may be taken which would show a pattern in the resist of periodicity 180 nm across the substrate. Thus, the pattern has half the period of the optical pattern.

The invention claimed is:

1. A method of lithographic patterning comprising:
    applying to a surface to be patterned a photoresist comprising a polymer resin, a photocatalyst generator which generates a catalyst on exposure to actinic radiation, and a quencher, wherein the quencher comprises 11-20% of the photoresist by weight;
    exposing the photoresist to actinic radiation through a mask pattern;
    carrying out a post-exposure bake; and then
    developing the photoresist with a developer to remove a portion of the photoresist which has been rendered soluble in the developer;
    wherein either the polymer resin is substantially insoluble in the developer prior to exposure to actinic radiation and rendered soluble in the developer by the action of the catalyst, and by the action of the quencher during the bake, or the polymer resin is soluble in the developer prior to exposure to actinic radiation and rendered substantially insoluble in the developer by the action of the catalyst, and by the action of the quencher during the bake.

2. A method according to claim 1, wherein the photocatalyst generator is a photoacid generator which generates an acid on exposure to actinic radiation.

3. A method according to claim 1, wherein the polymer resin comprises a polymer having back bone and a plurality of protected carboxylic acid groups.

4. A method according to claim 3, wherein the protected carboxylic acid groups are ester or acid anhydride groups.

5. A method according to claim 1, further comprising a hard bake after the post-exposure bake and the developing.

6. A method according to claim 1, wherein an excess of the quencher is used to provide frequency doubling by modifying the polymer resin during the bake.

7. A method according to claim 6, wherein the bake is performed at a bake temperature and wherein the quencher has a boiling point above the bake temperature.

8. A method of lithographic patterning comprising:
    applying to a surface to be patterned a photoresist comprising a polymer resin, a photocatalyst generator which generates a catalyst on exposure to actinic radiation, and a quencher, wherein the quencher comprises 11-20% of the photoresist by weight and wherein the polymer resin is rendered soluble or insoluble by the action of the quencher during heating in a post-exposure bake;
    exposing the photoresist to actinic radiation through a mask pattern;
    carrying out the post-exposure bake; and then
    developing the photoresist with a developer to remove a portion of the photoresist which has been rendered soluble in the developer;
    wherein either the polymer resin is substantially insoluble in the developer prior to exposure to actinic radiation and rendered soluble in the developer by the action of the catalyst, and by the action of the quencher during the bake, or the polymer resin is soluble in the developer prior to exposure to actinic radiation and rendered substantially insoluble in the developer by the action of the catalyst, and by the action of the quencher during the bake.

9. A method according to claim 8, wherein an excess of the quencher is used to provide frequency doubling by modifying the polymer resin during the bake.

10. A method according to claim 9, wherein the bake is performed at a bake temperature and wherein the quencher has a boiling point above the bake temperature.

11. A method according to claim 8, wherein the photocatalyst generator is a photoacid generator which generates an acid on exposure to actinic radiation.

12. A method according to claim 8, wherein the polymer resin comprises a polymer having back bone and a plurality of protected carboxylic acid groups.

13. A method according to claim 12, wherein the protected carboxylic acid groups are ester or acid anhydride groups.

14. A method according to claim 8, further comprising a hard bake after the post-exposure bake and the developing.

* * * * *